(12) United States Patent
Fujimura et al.

(10) Patent No.: US 9,663,712 B2
(45) Date of Patent: May 30, 2017

(54) ORGANIC LIGHT-EMITTING DEVICE

(71) Applicant: Panasonic Intellectual Property Management Co., Ltd., Osaka (JP)

(72) Inventors: Shinya Fujimura, Osaka (JP); Satoru Ohuchi, Osaka (JP); Hirofumi Fujita, Osaka (JP); Tatsunori Momose, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 4 days.

(21) Appl. No.: 14/702,189

(22) Filed: May 1, 2015

(65) Prior Publication Data
US 2015/0333284 A1  Nov. 19, 2015

(30) Foreign Application Priority Data
May 13, 2014  (JP) ................... 2014-099306

(51) Int. Cl.
*H01L 51/50*  (2006.01)
*C09K 11/06*  (2006.01)

(52) U.S. Cl.
CPC .......... *C09K 11/06* (2013.01); *H01L 51/5092* (2013.01); *C09K 2211/1416* (2013.01); *C09K 2211/1483* (2013.01); *H01L 2251/303* (2013.01)

(58) Field of Classification Search
CPC .......... H01L 51/5092; H01L 2251/303; H01L 51/50; C09K 2211/1416; C09K 11/1483
USPC ........................................... 257/40
See application file for complete search history.

(56) References Cited

U.S. PATENT DOCUMENTS

| 7,388,100 B2* | 6/2008 | Nishio | C07D 209/08 548/469 |
| 7,666,050 B2* | 2/2010 | Yamashita | G02F 1/133305 445/26 |
| 8,415,174 B2* | 4/2013 | Tanaka | G09G 3/006 257/E21.527 |

(Continued)

FOREIGN PATENT DOCUMENTS

| JP | 2015216291 A * | 12/2015 | ............. H01L 51/50 |
| WO | 2011/074633 | 6/2011 | |

OTHER PUBLICATIONS

Henk J. Bolink et al., "Inverted Solution Processable OLEDs Using a Metal Oxide as an Electron Injection Contact" Adv.Funct.Mater. 2008, 18, pp. 145-150.

(Continued)

*Primary Examiner* — Alexander Oscar Williams
(74) *Attorney, Agent, or Firm* — Renner, Otto, Boisselle & Sklar, LLP

(57) ABSTRACT

An organic light-emitting device includes: an organic light-emitting device that includes: a cathode; an anode facing the cathode; a functional layer located between the cathode and the anode, the functional layer including a light-emitting layer; and an electron-injection layer located between the cathode and the functional layer, the electron-injection layer at least partially composed of a metallic compound containing a metal element, wherein the electron-injection layer includes crystal grains in which the metallic compound is crystallized and the metal element has a d10 electron configuration in the outermost shell, and at least one of the crystal grains is in contact with both the cathode and the functional layer.

6 Claims, 14 Drawing Sheets

(56) References Cited

U.S. PATENT DOCUMENTS

| | | | |
|---|---|---|---|
| 9,012,892 B2* | 4/2015 | Chen | H01L 51/0005 |
| | | | 257/40 |
| 2004/0174116 A1* | 9/2004 | Lu | H01L 51/0021 |
| | | | 313/506 |
| 2008/0246036 A1* | 10/2008 | Yamazaki | H01L 27/1292 |
| | | | 257/72 |
| 2009/0236590 A1* | 9/2009 | Ohsawa | H01L 51/0052 |
| | | | 257/40 |
| 2010/0055899 A1 | 3/2010 | Mayer et al. | |
| 2010/0295040 A1* | 11/2010 | Horio | H01L 21/02403 |
| | | | 257/43 |
| 2011/0086796 A1 | 4/2011 | Wang et al. | |
| 2012/0256197 A1 | 10/2012 | Matsuhisa et al. | |
| 2014/0042423 A1* | 2/2014 | Ohuchi | H01L 51/5092 |
| | | | 257/40 |
| 2015/0137103 A1* | 5/2015 | Hosono | H01L 51/5072 |
| | | | 257/40 |

OTHER PUBLICATIONS

Henk J. Bolink et al., "Air stable hybrid organic-inorganic light emitting diodes using ZnO as the cathode" Appl. Phys. Lett. 91, 223501, 2007.

"Technology of transparent conductive film (second edition)" Ohmsha, Ltd. pp. 165-168, May 2007.

\* cited by examiner

ORGANIC LIGHT-EMITTING DEVICE

BACKGROUND

1. Technical Field

The present disclosure relates to an organic electroluminescent device (hereinafter referred to as an "organic EL device"), which is an electrical light-emitting device. In particular, the present disclosure relates to a low-power driving technique in a wide luminance range from low luminance to high luminance for light sources or the like.

2. Description of the Related Art

Organic EL devices are current-driven light-emitting devices and include a functional layer containing an organic material between a pair of electrodes, that is, an anode and a cathode. Organic EL devices are driven by utilizing electroluminescence. Electroluminescence is a luminous phenomenon generated by recombination of holes injected into a functional layer from an anode and electrons injected into the functional layer from a cathode in response to the application of a voltage between the anode and cathode. Organic EL devices advantageously have high visibility due to self-luminescence and high impact resistance because the organic EL devices are completely solid-state devices. Thus, organic EL devices receive attention as light-emitting devices or light sources in various display apparatuses.

In order to allow organic EL devices to efficiently emit bright light with low power consumption, it is important to efficiently inject carriers (holes and electrons) from electrodes into a functional layer. In order to efficiently inject carriers into a functional layer, an charge injection layer for lowering the injection energy barrier is generally disposed between electrodes and the functional layer. A hole-injection layer is disposed between a functional layer and an anode, and an electron-injection layer is disposed between a functional layer and a cathode.

Adv. Funct. Mater. 2008, 18, 145-150 discloses the use of titanium oxide in an electron-injection layer. Appl. Phys. Lett. 2007, 91, 223501 discloses the use of zinc oxide in an electron-injection layer. In this literature, a zinc oxide film is formed by spray pyrolysis. More specifically, the zinc oxide film is formed by spraying a cathode with a solution containing zinc acetate dihydrate and heat-treating the solution at 500° C. for 12 hours.

SUMMARY

There is a demand for an electron-injection layer that has high electron conductivity, a good electric contact with a cathode, and improved electron-injection efficiency.

One non-limiting and exemplary embodiment provides an organic light-emitting device that includes a novel electron-injection layer that has high electron conductivity, can have a good electric contact with a cathode, and has high efficiency of electron injection into a functional layer.

In order to solve the problems described above, in one general aspect, the techniques disclosed here feature an organic light-emitting device that includes: a cathode; an anode facing the cathode; a functional layer located between the cathode and the anode, the functional layer including a light-emitting layer; and an electron-injection layer located between the cathode and the functional layer, the electron-injection layer at least partially composed of a metallic compound containing a metal element, wherein the electron-injection layer includes crystal grains in which the metallic compound is crystallized and the metal element has a d10 electron configuration in the outermost shell, and at least one of the crystal grains is in contact with both the cathode and the functional layer. It should be noted that general or specific embodiments may be implemented as a device, a system, a method, or any selective combination thereof.

An embodiment of the present disclosure provides an organic light-emitting device that includes a novel electron-injection layer that has high electron conductivity, can have a good electric contact with a cathode, and has high efficiency of electron injection into a functional layer. Such an organic light-emitting device advantageously has a long life and consumes less power.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

An organic EL device according to an embodiment of the present disclosure will be described below with reference to the accompanying drawings. Subsequently, the results of an investigation of the structure and characteristics of an electron-injection layer performed by the present inventor will be described.

Except for its essential features, the present disclosure is not limited to the following embodiments. Components in the accompanying drawings do not have actual dimensions.

Embodiments

Structure of Organic EL Device

Figure 1:
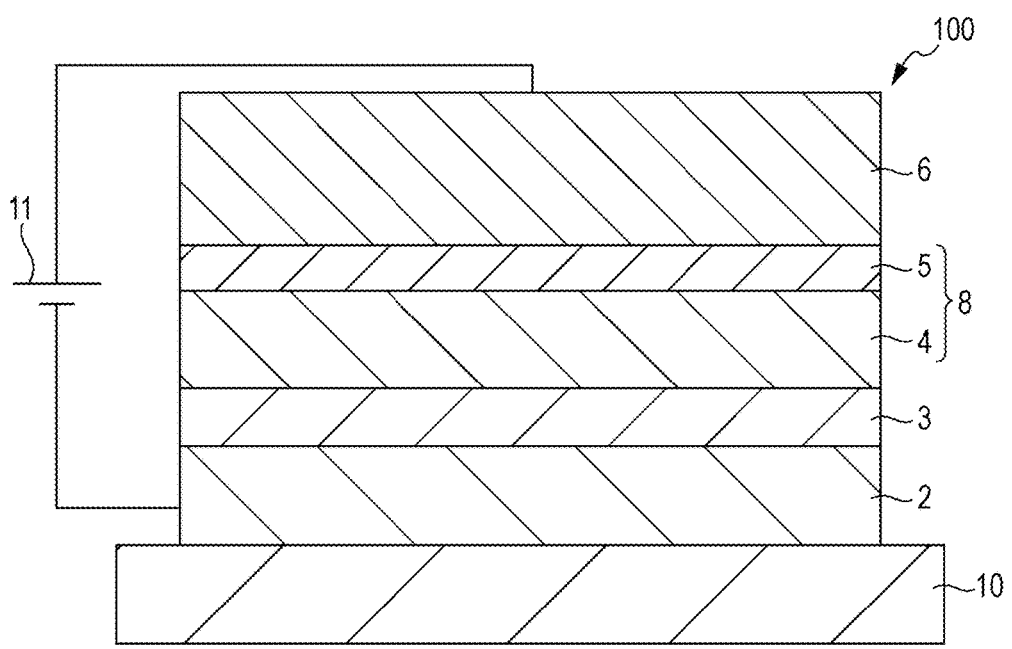
FIG. 1 is a schematic cross-sectional view of an organic EL device 100 according to a first embodiment.

FIG. 1 is a schematic cross-sectional view of part of an organic EL device 100 according to an embodiment.

The organic EL device 100 includes a layered body between a pair of electrodes composed of a cathode 2 and an anode 6. The layered body includes an electron-injection layer 3 and a functional layer 8, which includes a light-emitting layer 4.

More specifically, the organic EL device 100 includes the cathode 2, the anode 6, the functional layer 8 between the cathode 2 and the anode 6, and the electron-injection layer 3 between the cathode 2 and the functional layer 8. The functional layer 8 includes the light-emitting layer 4 and a hole-injection layer 5. The functional layer 8 may not include the hole-injection layer 5 as long as the functional layer 8 includes the light-emitting layer 4. The functional layer 8 may include an electron-transport layer and/or a hole-transport layer.

In the embodiment illustrated in FIG. 1, the organic EL device 100 is disposed on a substrate 10 and includes the cathode 2, the electron-injection layer 3, the light-emitting layer 4, the hole-injection layer 5, and the anode 6 disposed on the substrate 10 in this order. The anode 6 and the cathode 2 can be coupled to a power supply 11. Electricity can be supplied to the organic EL device 100 from the power supply 11 through the anode 6 and the cathode 2.

The electron-injection layer 3 in the present embodiment is formed of a metallic compound containing a metal element having a d10 electron configuration in the outermost shell. The metallic compound containing a metal element having a d10 electron configuration in the outermost shell may be zinc oxide. The term "a metallic compound containing a metal element having a d10 electron configuration in the outermost shell", as used herein, refers to a metallic compound that contains a metal element having a d orbital in the outermost shell, wherein the d orbital is occupied by 10 electrons. For example, in the case of zinc oxide having a stoichiometric composition, two valence electrons on the 4s orbital of the zinc atom are transferred to the oxygen atoms, and the 4s orbital becomes vacant. As a result, the zinc atom has a d10 electron configuration, in which 10 electrons occupy the 3d orbital in the outermost shell (hereinafter referred to as a 3d10 electron configuration). Thus, zinc oxide is a metallic compound that contains a metal element (zinc) that can have the 3d10 electron configuration. Examples of oxide compounds that contain a metal element having 10 electrons on the 4d orbital (4d10 electron configuration) include indium oxide and tin oxide. Examples of oxide compounds that contain a metal element having 10 electrons on the 5d orbital (5d10 electron configuration) include lead oxide.

Figure 2A:
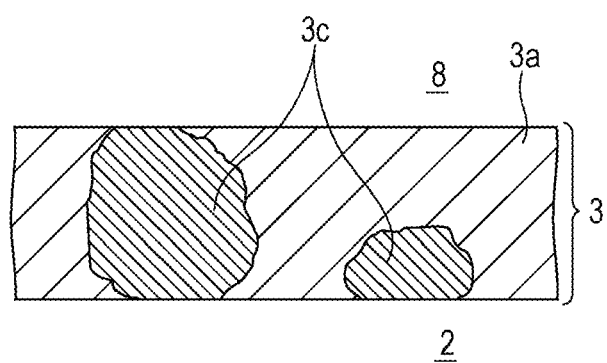
FIGS. 2A and 2B are schematic enlarged cross-sectional views of an electron-injection layer 3.
Figure 2B:
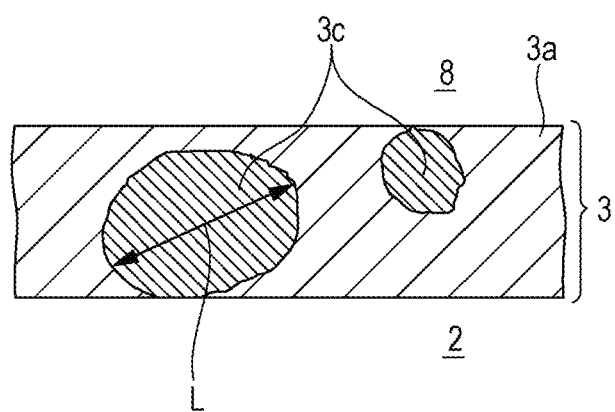

The electron-injection layer 3 contains a crystalline portion. FIGS. 2A and 2B are schematic cross-sectional views of the electron-injection layer 3. The electron-injection layer 3 contains crystal grains 3c and an amorphous body 3a.

As illustrated in FIG. 2A, at least one of the crystal grains 3c is in contact with both the cathode 2 and the functional layer 8. At least one of the crystal grains 3c may have a maximum length of 30 nm or more.

Alternatively, as illustrated in FIG. 2B, in a vertical section of the electron-injection layer 3, at least one of the crystal grains 3c may have a maximum length L of 30 nm or more. The term "maximum length L", as used herein, refers to the maximum length of a crystal grain 3c in any direction in a cross section of the crystal grain 3c. The term "length of a crystal grain 3c", as used herein, refers to the length from one point on an interface of the crystal grain 3c (an interface between the crystalline portion and the amorphous body 3a) to another point on the interface. In the present embodiment, the crystal grains 3c may have the maximum length in at least one vertical section of the electron-injection layer 3 and do not have to have the maximum length in all the vertical sections of the electron-injection layer 3.

In the present embodiment, the electron-injection layer 3 is a metallic compound layer containing a metal element having a d10 electron configuration in the outermost shell. This results in high efficiency in electron injection from the cathode 2 to the electron-injection layer 3 and a good electric contact between the cathode 2 and the electron-injection layer 3. This also results in high efficiency in electron injection from the electron-injection layer 3 to the functional layer 8. Furthermore, the electron-injection layer 3 has high crystallinity and effectively forms a donor level in the vicinity of a lower end of a conduction band contributing to electrical conductivity, thus having high electron conductivity. The term "high crystallinity", as used herein, refers to high crystal quality (a fewer defects, larger crystal grains, and a donor level in the vicinity of a lower end of a valence band). A mechanism for producing these effects will be described in detail below. Because the organic EL device 100 includes the electron-injection layer 3, the organic EL device 100 has a long life and consumes less power.

In Appl. Phys. Lett. 2007, 91, 223501, a zinc oxide film is formed as an electron-injection layer. A method (spray pyrolysis) described in this literature is not performed in a vacuum process. This results in contamination with large amounts of impurity elements and insufficient crystal growth by heating. Thus, large crystal grains, for example, as described above with reference to FIGS. 2A and 2B are not formed, and the zinc oxide film only contains relatively small crystal grains. Since impurity elements form an inter-bandgap level, the electron conductivity may be lowered. Neither the relationship between the composition and crystal defects and the electron-injection characteristics nor the optimum state of an electron-injection layer is described in Adv. Funct. Mater. 2008, 18, 145-150 and "Tomeidodenmaku no gijutsu (Technique for transparent electrically conductive film", Ohmsha, Ltd. (2008).

The electron-injection layer 3 may have any thickness, for example, in the range of 10 to 1000 nm. In the case that at least one of the crystal grains 3c is in contact with both the cathode 2 and the functional layer 8 (FIG. 2A), the electron-injection layer 3 has a thickness in the range of 10 to 50 nm, for example. Even when the electron-injection layer 3 has a thickness of more than 30 nm or more than 50 nm, and the crystal grains 3c are not in contact with the cathode 2 and the functional layer 8, the same effects can be produced as long as the crystal grains 3c have a maximum length L of 30 nm or more (FIG. 2B).

The electron-injection layer 3 may have any degree of crystallinity. For example, the half-width of an X-ray diffraction peak of a (002) plane of zinc oxide at 2θ in the range of 33 to 35 degrees may be less than 0.576 degrees.

Alternatively, the electron-injection layer 3 may have a half-width of less than 67% of the half-width of an X-ray diffraction peak of a zinc oxide film not subjected to heating. This can effectively increase electron conductivity.

The electron-injection layer 3 may be formed of zinc oxide. In addition to the effects described above (a good electric contact with the cathode 2, high electron-injection efficiency, and high electron conductivity), this can improve stability and transmittance in the atmosphere. In this case, the electron-injection layer 3 may be composed of zinc and oxygen and may contain trace amounts of impurities that can be generally incorporated and do not decrease electron conductivity. The ratio (mole ratio) x of zinc to oxygen may be more than 1. The electron-injection layer 3 may be formed using the method described below.

The specific structure of the layers of the organic EL device 100 will be described below.

Cathode

The cathode 2 may be a thin film formed of indium tin oxide (ITO) and having a thickness of 50 nm.

Electron-Injection Layer

The electron-injection layer 3 is formed of zinc oxide and may have a thickness of 20 nm.

Light-Emitting Layer

The light-emitting layer 4 may be formed of poly(9,9-di-n-octylfluorene-alt-benzothiadiazole) (F8BT) and may have a thickness of 85 nm.

The light-emitting layer 4 is not necessarily formed of the material described above and may be formed of a known material. Examples of such a known material include fluorescent substances, such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes of 8-hydroxyquinoline compounds, metal complexes of 2-bipyridine compounds, complexes of Schiff salts and group III metals, oxine metal complexes, and rare earth complexes, as described in Japanese Unexamined Patent Application Publication No. 5-163488.

Hole-Injection Layer

The hole-injection layer 5 may be formed of molybdenum oxide and may have a thickness of 20 nm. The hole-injection layer 5 has optimized hole injection properties and high hole injection efficiency.

Anode

The anode 6 may be composed of aluminum and may have a thickness of 100 nm.

Substrate

The substrate 10 can be formed of an insulating material, such as non-alkali glass, soda-lime glass, nonfluorescent glass, phosphate glass, borate glass, quartz, acrylic resin, styrene resin, polycarbonate resin, epoxy resin, polyethylene, polyester, silicon resin, or alumina.

Method for Manufacturing Organic EL Device 100

A method for manufacturing the organic EL device 100 will be described below with reference to FIG. 1.

First, the cathode 2 is formed on a main surface of the substrate 10. The substrate 10 is placed in a chamber of a sputtering apparatus. A sputtering gas is then introduced into the chamber. The cathode 2 formed of ITO and having a thickness of 50 nm is formed on the main surface of the substrate 10 by reactive sputtering.

A metallic compound film is then formed on the cathode 2. The metallic compound film contains a metal element that can have a d10 electron configuration in the outermost shell. The metallic compound film can be formed by sputtering, vacuum evaporation, chemical vapor deposition (CVD), or a sol-gel process. The metallic compound film may be formed by a sol-gel process in an environment in which contamination with impurities that decrease electron conductivity can be prevented. Immediately after the formation of the metallic compound film, the metal element may not have the d10 electron configuration in the outermost shell. In the present embodiment, while the substrate 10 is placed in the chamber of the sputtering apparatus, a sputtering gas is introduced into the chamber, and a zinc oxide film having a thickness of 20 nm is formed as the metallic compound film by reactive sputtering.

The metallic compound film is then subjected to heat treatment at a predetermined temperature. The heat-treatment temperature may be, but is not limited to, 200° C. or more, desirably 300° C. or more, more desirably 400° C. or more. In the present embodiment, the substrate 10 on which the metallic compound film is formed is removed from the chamber and is then subjected to heat treatment on a hot plate in the atmosphere at a predetermined temperature of 200° C. or more for 30 minutes.

The electron-injection layer 3 thus formed by the heat treatment contains a metal element having a d10 electron configuration in the outermost shell and has high crystallinity.

The electron-injection layer 3 may be formed using another method. The metallic compound film may be formed on the cathode 2 while the substrate 10 is heated to a predetermined temperature. The temperature of the substrate 10 may be, but is not limited to, 200° C. or more, desirably 300° C. or more, more desirably 400° C. or more. The metallic compound film may be formed using the method described above (sputtering, vacuum evaporation, CVD, or a sol-gel process). When the metallic compound film is formed while the substrate 10 is heated, the subsequent heat treatment can be omitted. For example, while the substrate 10 is heated to 200° C. or more, the electron-injection layer 3 formed of zinc oxide and having a thickness of 20 nm may be formed on the cathode 2 by reactive sputtering. When the zinc oxide film is formed while the substrate 10 is heated, for example, to 200° C. or more, the electron-injection layer 3 thus formed can contain a metal element having a d10 electron configuration in the outermost shell and have high crystallinity without the subsequent heat treatment.

After the electron-injection layer 3 is formed, the substrate 10 is cooled to room temperature. The light-emitting layer 4 formed of F8BT and having a thickness of 85 nm is then formed, for example, by spin coating. The hole-injection layer 5 formed of molybdenum oxide and having a thickness of 20 nm and the anode 6 formed of aluminum and having a thickness of 100 nm are then formed in this order, for example, by resistance-heating evaporation. In this manner, the organic EL device 100 is manufactured.

Although not shown in the figure, in order to improve electron transport, an electron-transport layer having an electron-transport function may be disposed between the electron-injection layer 3 and the light-emitting layer 4. Furthermore, in order to improve hole transport, a hole-transport layer having a hole-transport function may be disposed between the light-emitting layer 4 and the hole-injection layer 5.

Although not shown in the figure, in order to prevent the organic EL device 100 from being exposed to the atmosphere, a sealing layer may be formed on the anode 6, or a sealing can for isolating the organic EL device 100 from the atmosphere may be provided. The sealing layer may be formed of silicon nitride (SiN), silicon oxynitride (SiON), or a material like a resin that can prevent components, such as water and oxygen, in the atmosphere from entering the organic EL device 100. The sealing layer is formed so as to enclose the organic EL device 100. The sealing can may be formed of the material of the substrate 10. A getter for adsorbing water and other components is disposed within the sealing can.

The organic EL device 100 that includes the electron-injection layer 3 formed of zinc oxide has the following advantages.

The electron-injection layer 3 formed of zinc oxide has a high zinc/oxygen ratio and contains interstitial zinc. Thus, a donor level due to the interstitial zinc improves electron conductivity. Furthermore, the electron-injection layer 3 has high crystallinity and is composed mostly of a crystalline portion. Excess zinc between lattices in zinc oxide having a substantially complete d10 electron configuration forms interstitial zinc. An electron injected into a donor level due to the interstitial zinc can be easily injected into the adjacent light-emitting layer 4 through an electron-conducting donor level of the Zn4s orbital. Most of zinc in the electron-injection layer 3 has a d10 electron configuration. Thus, the electron-injection layer 3 retains its wide band gap and is highly transparent. Furthermore, because zinc oxide is stable in the atmosphere and can prevent degradation caused by oxygen and water in the atmosphere. Thus, the organic EL device 100 has high electron-injection efficiency, electron-transport efficiency, luminous efficiency, transmittance, and stability in the atmosphere.

The metallic compound of the electron-injection layer 3 may be represented by the composition formula ZnOx. The variable x in the composition formula may be 0.9 or more and less than 1. This increases interstitial zinc in the electron-injection layer 3. As a result, a donor level is formed in the electron-injection layer 3 formed of zinc oxide, and the energy at the lowest end of the conduction band of zinc oxide approaches the Fermi level. This further lowers the electron-injection barrier between the cathode 2 and the electron-injection layer 3 and effectively improves the efficiency in electron injection from the cathode 2 to the electron-injection layer 3.

The electron-injection layer 3 may be doped with a group IIIB element. The group IIIB element in the electron-injection layer 3 increases donor levels. This increases the probability of electrons being transferred through the donor levels resulting from the doping of the group IIIB element in the electron-injection layer 3, thereby effectively improving the electron conductivity of the electron-injection layer 3.

Structure and Characteristics of Metal Oxide Film

The present inventor studied the structure and characteristics of a metal oxide film for use in the electron-injection layer. A zinc oxide film will be described below as an example of the metal oxide film. The structure and characteristics of metal oxide films subjected to different heat-treatment conditions and the characteristics of organic EL devices that include these metal oxide films were investigated and are described below.

Composition and Structure of Zinc Oxide Film

The composition and structure of zinc oxide film samples subjected to different heat-treatment conditions were investigated and are described below.

A zinc oxide film having a thickness of 20 nm was formed on an indium tin oxide (ITO) substrate by sputtering. A 99.99% pure zinc oxide (manufactured by Furuuchi Chemical Corporation) was used as a target. The concentration of impurity elements in the zinc oxide film was 100 ppm or less. The zinc oxide film was used as a zinc oxide film sample of a comparative example not subjected to heat treatment (hereinafter referred to as an "as-depo. film").

Zinc oxide films formed in the same manner as the as-depo. film were subjected to heat treatment at 200° C., 300° C., and 450° C. These zinc oxide film samples subjected to heat treatment were used as examples and are hereinafter referred to as a "200° C. annealed film", "300° C. annealed film", and "450° C. annealed film". The heat treatment was performed as described above. It was confirmed in another experiment that the ITO substrate did not deteriorate by heat treatment at these temperatures.

1. XPS Measurement

The zinc oxide film samples thus prepared were subjected to X-ray photoelectron spectroscopy (XPS). In general, XPS spectra reflect the chemical state and composition information in terms of the concentrations of elements from a surface of an object to be measured to a depth of a few nanometers.

XPS Measurement Conditions

Figure 3:
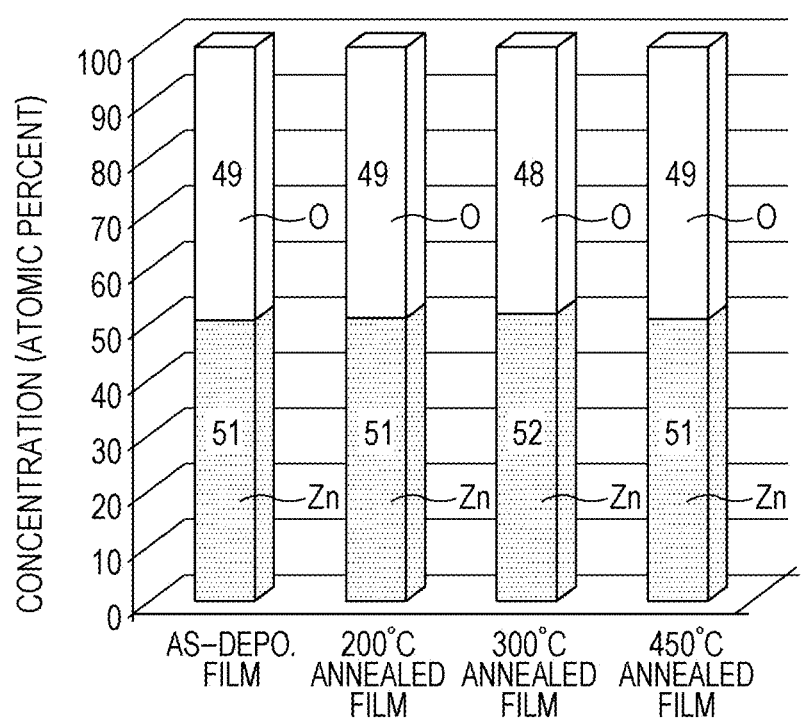
FIG. 3 is a graph showing the component ratio of a zinc oxide film.

Apparatus: X-ray and ultraviolet photoelectron spectrometer
PHI5000 VersaProbe (manufactured by ULVAC-PHI, Inc.)
Light source: AlKα monochromatic light (1486.6 eV)
Photoelectron exit angle: Normal to substrate
Measured energy resolution: 0.05 eV FIG. 3 is a bar graph showing the ratio of zinc to oxygen in each zinc oxide film. The horizontal axis represents the sample name. The vertical axis represents the concentration ratio of zinc to oxygen. The total concentration of zinc and oxygen is 100%. The graph in FIG. 3 shows that the ratio of zinc to oxygen of the zinc oxide film samples varies little. In all the samples, the concentration of zinc is slightly higher than the concentration of oxygen. In these samples, x of the composition formula ZnOx is 0.9 or more and less than 1 (approximately 0.94 to 0.96). Thus, the samples contain excessive zinc irrespective of heat treatment or heating temperature.

2. TEM Observation

The structures of the as-depo. film, 200° C. annealed film, 300° C. annealed film, and 450° C. annealed film were investigated with a transmission electron microscope (TEM).

First, an as-depo. film sample for TEM observation was prepared by forming a zinc oxide film (thickness: 20 nm) on a Si substrate by sputtering. 200° C. annealed film, 300° C. annealed film, and 450° C. annealed film samples for TEM observation were prepared by forming a zinc oxide film (thickness: 20 nm) on a Si substrate by sputtering and heat-treating the zinc oxide film at a predetermined temperature. The zinc oxide film of these samples was covered with a coating material (carbon). It was confirmed by another method that zinc oxide films formed on a Si substrate had substantially the same quality as zinc oxide films formed on an ITO substrate.

In TEM observation, an area to be observed had a small thickness. In the present embodiment, the thickness of a cross section to be observed (a cross section perpendicular to the Si substrate) was decreased to approximately 50 nm with a focused ion beam (hereinafter referred to as FIB) apparatus.

Figure 4A:
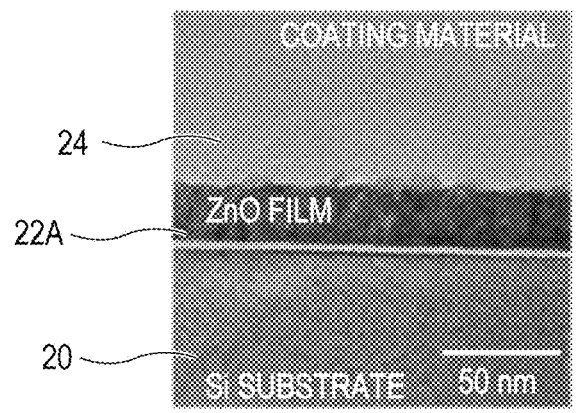
FIGS. 4A and 4B are cross-sectional TEM images of a zinc oxide film not subjected to heat treatment (as-depo. film)
Figure 4B:
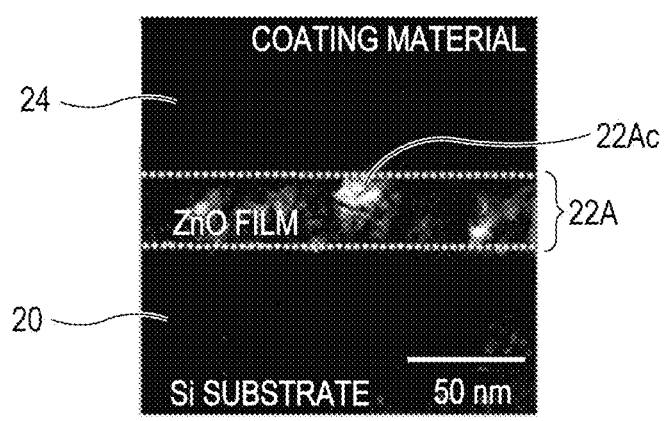
Figure 5A:
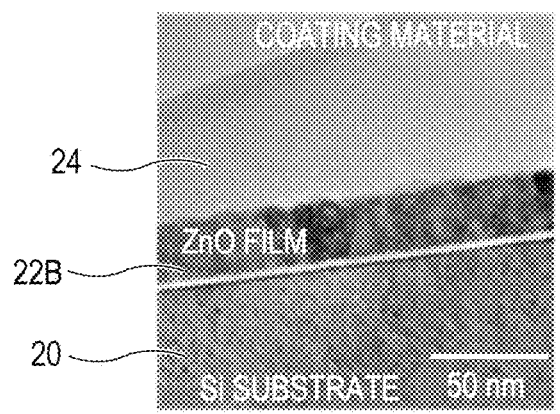
FIGS. 5A and 5B are cross-sectional TEM images of a zinc oxide film subjected to heat treatment at 200° C. (200° C. annealed film)
Figure 5B:
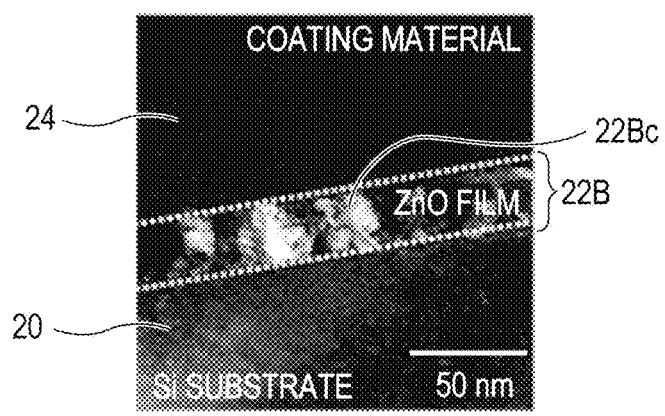
Figure 6A:
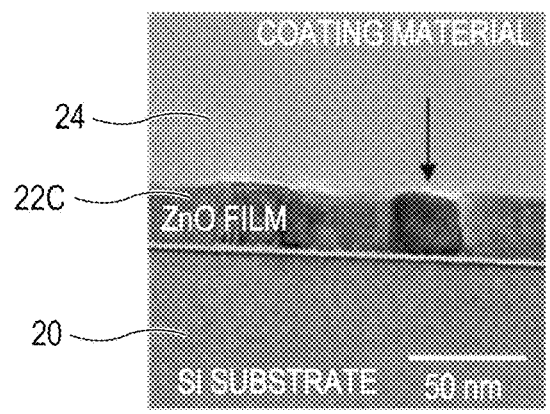
FIGS. 6A and 6B are cross-sectional TEM images of a zinc oxide film subjected to heat treatment at 450° C. (450° C. annealed film)
Figure 6B:
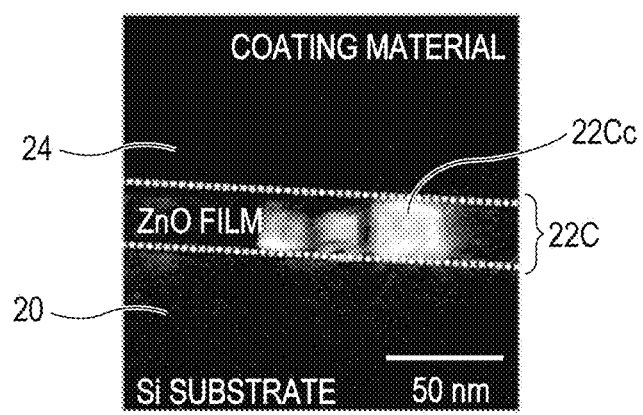

The conditions for FIB processing and TEM observation were as follows:
FIB Processing Conditions:
Apparatus: SII-3050SE (manufactured by SII NanoTechnology Inc.)
Accelerating voltage: 30 kV (rough processing), 5 kV (finish processing)
Thickness of thin film: 50 nm
TEM Observation Conditions:
Observation method: High-resolution electron microscopy
Apparatus: Field-emission electron microscope HF-2200 (manufactured by Hitachi, Ltd.)
Accelerating voltage: 200 kV FIGS. 4 to 6 are cross-sectional TEM images of an as-depo. film, a 200° C. annealed film, and a 450° C. annealed film, respectively. The scale bar in the figures indicates the scale. FIGS. 4A, 5A, and 6A are bright-field images of TEM photographs, and FIGS. 4B, 5B, and 6B are dark-field images of the TEM photographs. The fields of the bright-field images and the dark-field images are the same in FIGS. 4A to 6B.

The bright-field images are formed by selecting diffracted waves including transmitted waves of electrons that vertically enter the TEM observation surface through an objective aperture. The diffracted portion appears dark because the number of electron beams from transmitted waves is decreased, and the non-diffracted portion appears bright because the number of electron beams is increased.

The dark-field images are formed by selecting limited diffracted waves of electrons that vertically enter the TEM observation surface through an objective aperture. The dark-field images can have a contrast that depends on crystalline orientation with respect to the electron beam transmission direction and are more suitable for the observation of particular crystal grains than the bright-field images.

The bright-field images in FIGS. 4A, 5A, and 6A clearly show a zinc oxide film (an as-depo. film 22A, a 200° C. annealed film 22B, or a 450° C. annealed film 22C) formed on a Si substrate 20. The undersurface of the zinc oxide film is in contact with substrate 20, and the top surface of the zinc oxide film is covered with a coating material 24.

The crystalline state of the zinc oxide film of each sample will be described below with reference to the dark-field images in FIGS. 4B, 5B, and 6B.

In the as-depo. film 22A in FIG. 4B, crystal grains 22Ac appear as bright portions. However, no crystal grain is in contact with both the Si substrate 20 and the top surface of the as-depo. film 22A (a surface adjacent to the coating material 24). The crystal grains 22Ac have a small size, and no crystal grain has a maximum length of 30 nm or more.

In the 200° C. annealed film 22B in FIG. 5B, crystal grains 22Bc appear as bright portions. At least one of the crystal grains 22Bc is in contact with both the Si substrate 20 and the top surface of the 200° C. annealed film 22B. Likewise, in the 450° C. annealed film 22C in FIG. 6B, crystal grains 22Cc appear as bright portions. At least one of the crystal grains 2Cc is in contact with both the Si substrate 20 and the top surface of the 450° C. annealed film 22C. When the 200° C. annealed film 22B or the 450° C. annealed film 22C is used in the electron-injection layer 3 of the organic EL device 100 illustrated in FIG. 1, at least one of the crystal grains is in contact with both the substrate 10 and the functional layer 8. Although not shown in the figure, the same results are obtained with the 300° C. annealed film.

These results show that the electron-injection layer 3 in the present embodiment can be formed by heating a zinc oxide film on the substrate 10 at a predetermined temperature. In the electron-injection layer 3 thus formed, the concentration of zinc is higher than the concentration of oxygen, and at least one of crystal grains is in contact with both the substrate and the functional layer.

In this embodiment, the maximum length of at least one crystal grain in the 200° C. annealed film 22B or the 450° C. annealed film 22C is limited to 20 nm by the thickness of the zinc oxide film (20 nm). When the thickness of the zinc oxide film is increased, the maximum length can be 30 nm or more, for example.

3. XRD Measurement

The degree of crystallinity of the as-depo. film, 200° C. annealed film, 300° C. annealed film, and 450° C. annealed film was investigated by X-ray diffractometry (XRD).

First, as-depo. film, 200° C. annealed film, 300° C. annealed film, and 450° C. annealed film samples for XRD were prepared in the same manner as the samples for TEM observation. It was confirmed by another method that zinc oxide films formed on a Si substrate had substantially the same quality as zinc oxide films formed on an ITO substrate.

The conditions for XRD are as follows:
Conditions for XRD:
Apparatus: Intelligent X-ray diffraction system SmartLab (manufactured by Rigaku Corporation). " SmartLab" is a registered trademark.
Irradiation light source: Cukα monochromatic light (8.048 keV)
Measurement method: 2θ/θ method (out-of-plane measurement)

Figure 7:
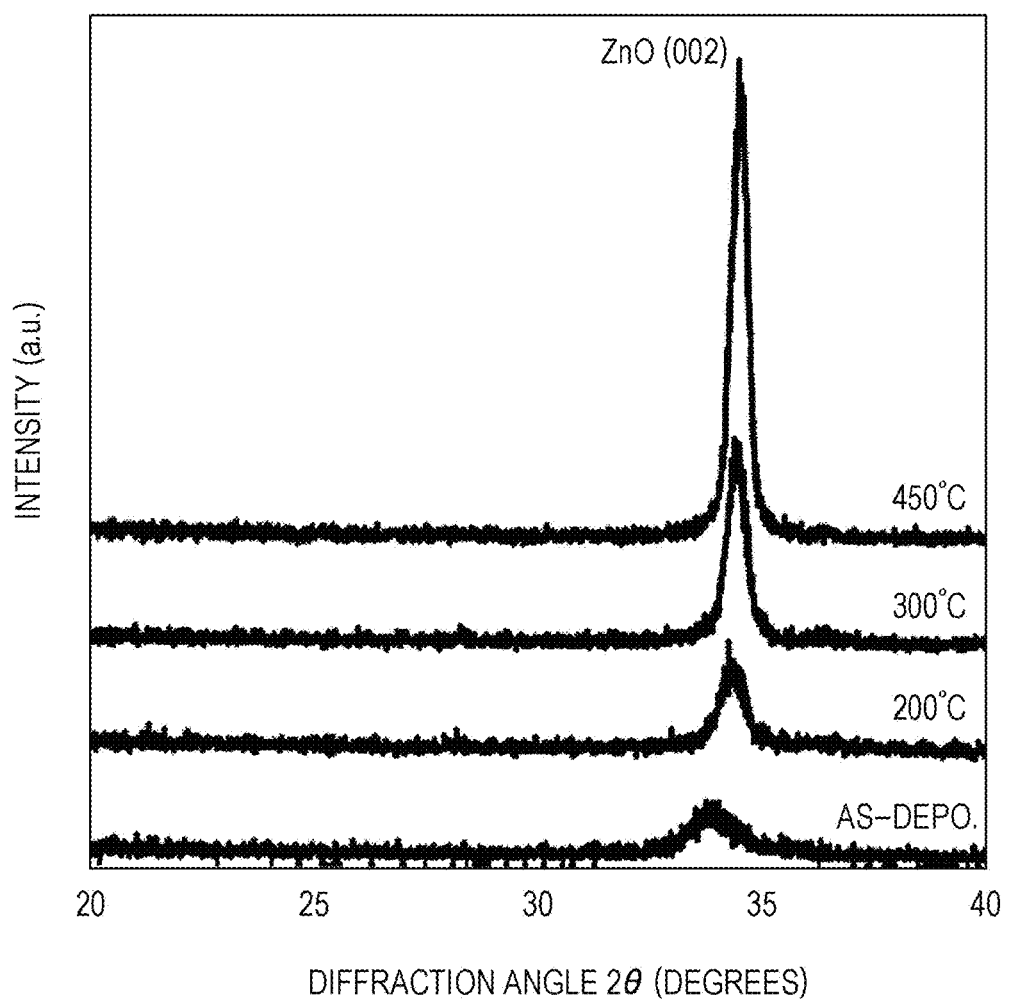
FIG. 7 is a graph of XRD spectra of zinc oxide films (as-depo. film, 200° C. annealed film, 300° C. annealed film, and 450° C. annealed film)

FIG. 7 shows XRD spectra of the as-depo. film, 200° C. annealed film, 300° C. annealed film, and 450° C. annealed film. In the 2θ/θ method, θ denotes the incident angle with respect to the sample surface, and an X-ray diffracted at an angle of 2θ with respect to the direction of radiation of the incident X-ray is detected. In FIG. 7, the horizontal axis represents 2θ, and the vertical axis represents the intensity of a diffracted X-ray in an arbitrary unit. The intercepts of XRD spectra are arbitrarily translated.

FIG. 7 shows that the diffraction pattern peak of a (002) plane of zinc oxide appears at an annealing temperature of 200° C. or more. With an increase in annealing temperature, the peak intensity increases, and the peak becomes sharper. This indicates that the crystallinity of the zinc oxide film increases with the annealing temperature. Thus, the crystal grain size increases with the annealing temperature.

The full width at half maximum (FWHM) of the X-ray diffraction peak of the (002) plane of zinc oxide at 2θ in the range of 33 to 35 degrees was determined from the XRD measurements of the as-depo. film, 200° C. annealed film, 300° C. annealed film, and 450° C. annealed film. The FWHM of the X-ray diffraction peaks for the as-depo. film, 200° C. annealed film, 300° C. annealed film, and 450° C. annealed film were 0.855, 0.576, 0.443, and 0.395 degrees, respectively. The ratios R of the FWHM of the annealed film to the FWHM of the as-depo. film were 67%, 52%, and 46% for the 200° C. annealed film, 300° C. annealed film, and 450° C. annealed film, respectively.

Figure 14:
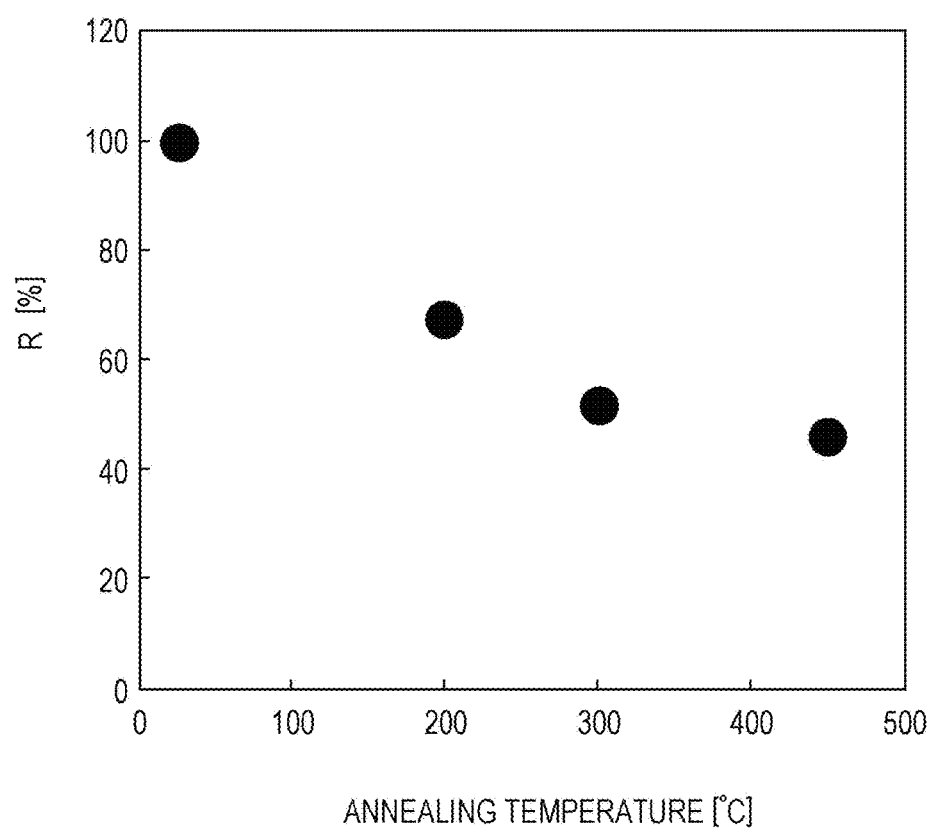
FIG. 14 is a graph showing the half-width of an X-ray diffraction peak of zinc oxide films (as-depo. film, 200° C. annealed film, 300° C. annealed film, and 450° C. annealed film) as a function of annealing temperature.

FIG. 14 is a graph showing the ratio R of the FWHM for the annealed film as a function of annealing temperature. In FIG. 14, the annealing temperature for the as-depo. film is assumed to be 25° C. FIG. 14 shows that the crystallinity of the zinc oxide film increases with the annealing temperature.

Electronic State of Zinc Oxide

4. PL Measurement

The band gap and intrabandgap level of the as-depo. film, 200° C. annealed film, 300° C. annealed film, and 450° C. annealed film were investigated by photoluminescence (PL).

First, as-depo. film, 200° C. annealed film, 300° C. annealed film, and 450° C. annealed film samples for PL measurement were prepared in the same manner as the samples for TEM observation. It was confirmed by another method that zinc oxide films formed on a Si substrate had substantially the same quality as zinc oxide films formed on an ITO substrate.

The conditions for PL measurement are as follows:

PL Measurement Conditions:

Apparatus: LabRAM HR-800 (manufactured by Horiba, Ltd.). "LabRAM" is a registered trademark.

Excitation light source: He—Cd laser

Excitation wavelength: 325 nm

Detection method: Spectral components separated with a monochromator is detected with a CCD.

Figure 8:
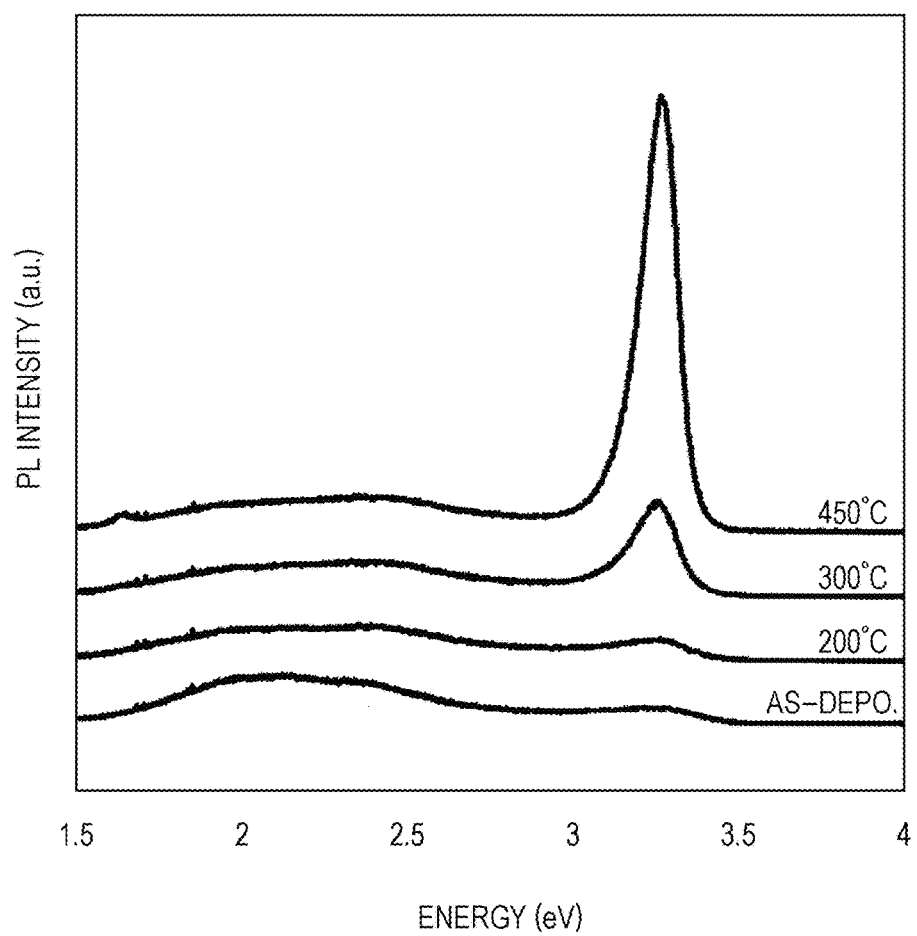
FIG. 8 is a graph of PL spectra of zinc oxide films (as-depo. film, 200° C. annealed film, 300° C. annealed film, and 450° C. annealed film)

FIG. 8 shows PL spectra of the as-depo. film, 200° C. annealed film, 300° C. annealed film, and 450° C. annealed film. The horizontal axis represents PL energy, and the vertical axis represents PL intensity, which is the number of detected photons per second. The intercepts of PL spectra are arbitrarily translated.

FIG. 8 shows that the 300° C. annealed film and 450° C. annealed film had a band-edge luminescence peak at 3.26 eV. Although the band-edge luminescence peak of the 200° C. annealed film in the vicinity of 3.26 eV was not clear, it was slightly sharper than the broad band-edge luminescence peak of the as-depo. film.

The as-depo. film has a clear emission peak that is composed of a plurality of broad peaks and results from impurity levels in a band gap in an energy range of 1.5 to 3.0 eV. In contrast, the emission peak due to impurity levels in a band gap was weaker in the annealed films subjected to heat treatment at a temperature of 200° C. or more than in the as-depo. film.

These results show that heat treatment of a zinc oxide film at a predetermined temperature can decrease impurity levels in a band gap relative to an as-depo. film not subjected to heat treatment and create an electronic state having a band structure.

As described above, in the case of zinc oxide having a stoichiometric composition, two valence electrons on the 4s orbital of the zinc atom are transferred to the oxygen atoms, and the 4s orbital becomes vacant. Thus, the 3d orbital occupied by 10 electrons becomes the outermost shell (d10 electron configuration). The zinc oxide films subjected to heat treatment at 200° C. or more (200° C. annealed film, 300° C. annealed film, and 450° C. annealed film) have a band structure, have few impurity levels, and are therefore formed of a metallic compound containing a metal element (zinc) having a substantially complete d10 electron configuration.

Furthermore, because impurity levels between band gaps are very few, the zinc oxide films subjected to heat treatment at 200° C. or more (200° C. annealed film, 300° C. annealed film, and 450° C. annealed film) have very low optical absorption in the visible light region and are substantially colorless. Thus, when such zinc oxide films are used in the electron-injection layer, the organic EL device can have high transmittance.

5. UPS Measurement

An as-depo. film, 200° C. annealed film, 300° C. annealed film, and 450° C. annealed film were subjected to ultraviolet photoelectron spectroscopy (UPS). In general, UPS spectra reflect the state of an occupancy level in a valence band or the like from a surface of an object to be measured to a depth of a few nanometers.

First, as-depo. film, 200° C. annealed film, 300° C. annealed film, and 450° C. annealed film samples for UPS were prepared in the same manner as the samples for XPS.

The conditions for UPS are as follows:

Conditions for UPS

Apparatus: X-ray and ultraviolet photoelectron spectrometer PHI5000 VersaProbe (manufactured by ULVAC-PHI, Inc.)

Light source: He I line

Bias: None

Photoelectron exit angle: Normal to substrate

Measurement point intervals: 0.05 eV

Figure 9:
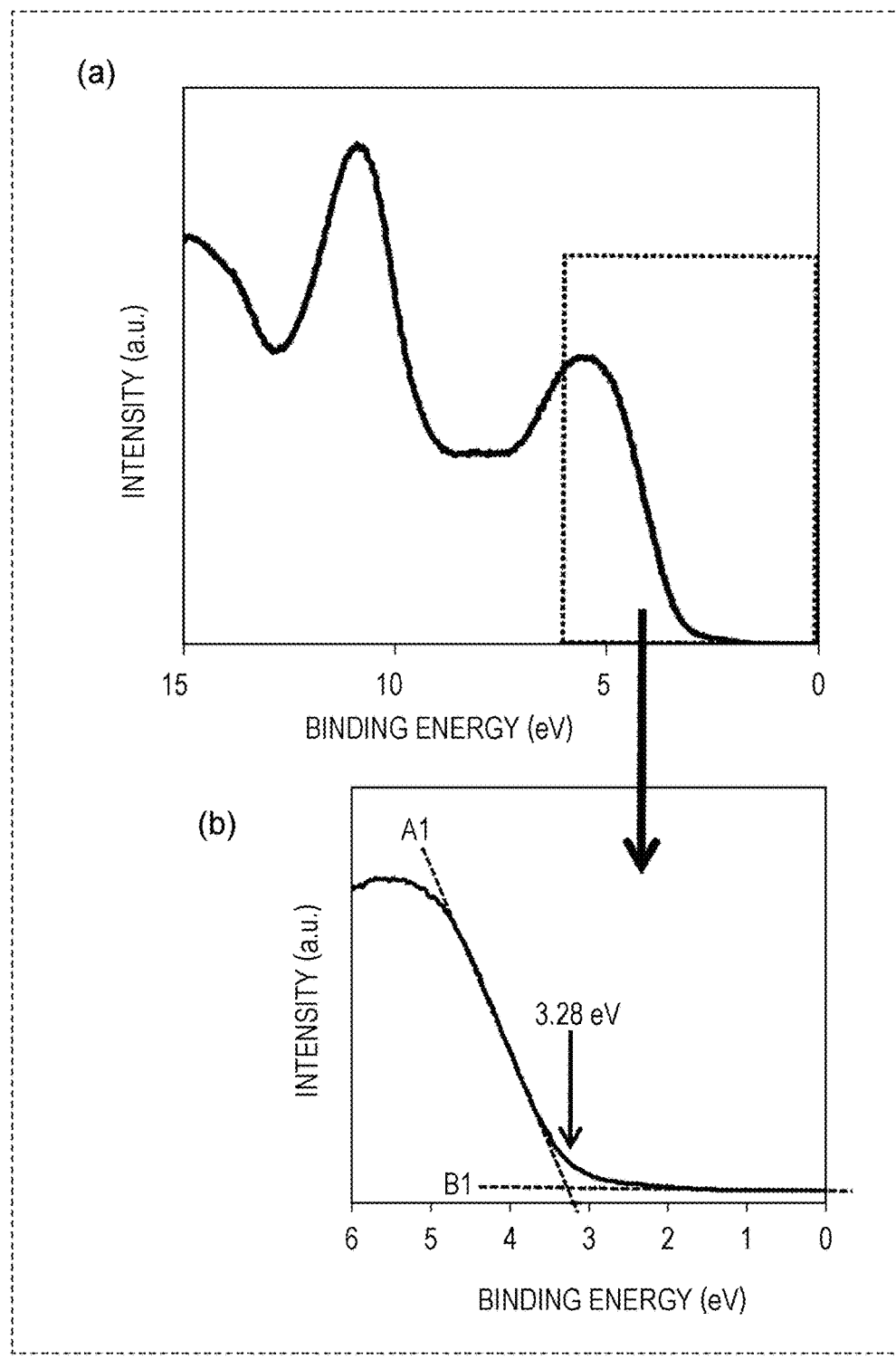
FIG. 9 shows a UPS spectrum of a zinc oxide film not subjected to heat treatment (as-depo. film) and a fragmentary enlarged view thereof.
Figure 10:
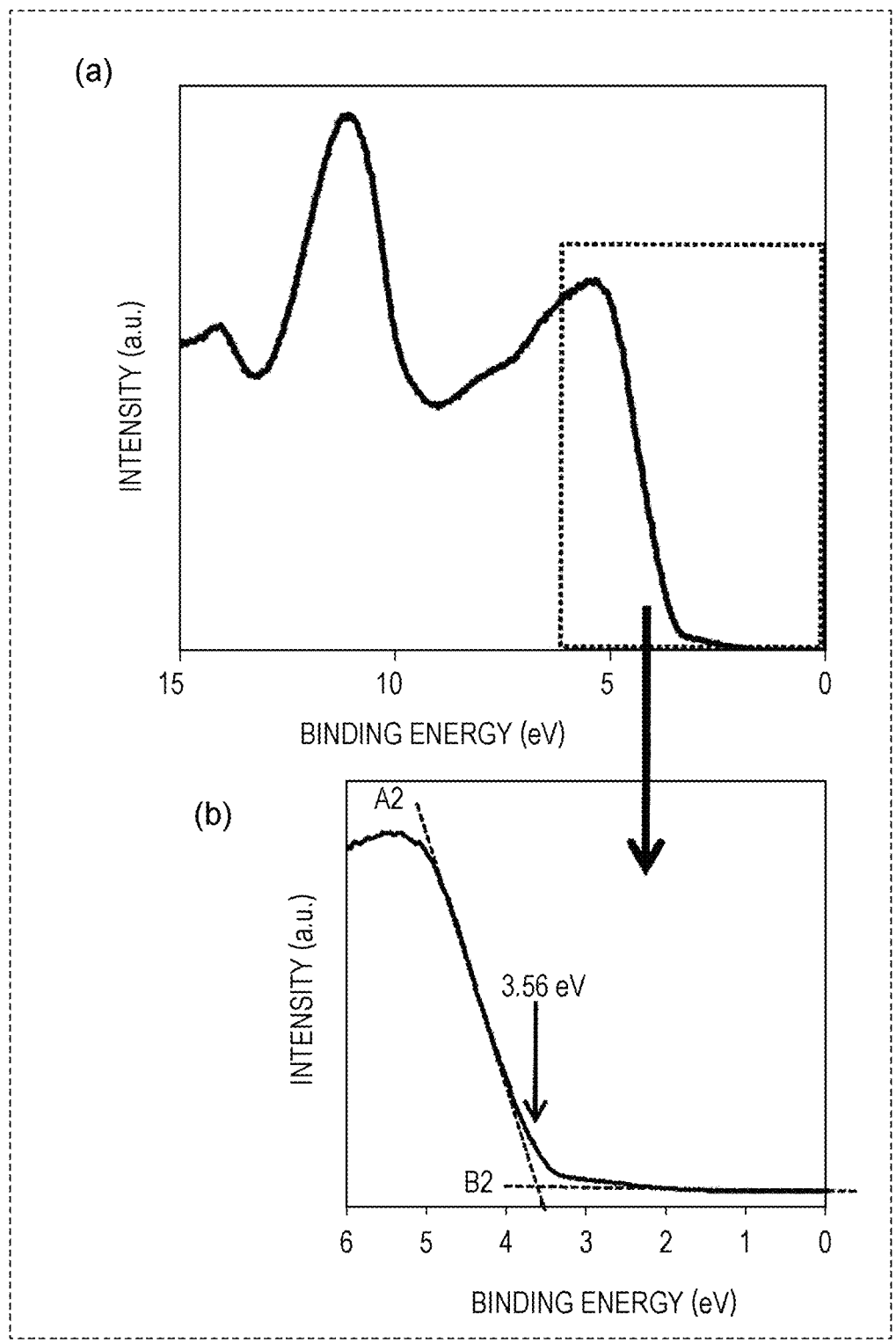
FIG. 10 shows a UPS spectrum of a zinc oxide film subjected to heat treatment at 450° C. (450° C. annealed film) and a fragmentary enlarged view thereof.

FIG. 9 shows a UPS spectrum of the as-depo. film. FIG. 10 shows a UPS spectrum of the 450° C. annealed film. In FIGS. 9 and 10, the horizontal axis represents binding energy. The origin of the horizontal axis is the Fermi level of an ITO substrate (identical to the Fermi level of a zinc oxide film), and the leftward direction is the positive direction (along which the binding energy increases). The vertical axis represents photoelectron intensity normalized with respect to the maximum value of each UPS spectrum. FIGS. 9(*b*) and 10(*b*) are enlarged views of an energy region in the vicinity of the Fermi level of the UPS spectra shown in FIGS. 9(*a*) and 10(*a*) (indicated by the dotted line).

The largest rising portion in the UPS spectrum of zinc oxide corresponds to an upper end of the valence band of the O2p orbital. A point of intersection between the horizontal axis and a tangent line (lines A1 and A2) passing through an inflection point of the rising portion in the UPS spectrum is considered to be the binding energy point of the upper end of the valence band.

As shown in FIG. 9B, for the as-depo. film, the binding energy at a point of intersection between the tangent line (line A1) passing through an inflection point of the rising portion in the UPS spectrum and a line along the horizontal axis passing through a right ordinate intercept of the USP spectrum (line B1) is 3.28 eV. As shown in FIG. 10B, for the 450° C. annealed film, the binding energy at a point of intersection between the tangent line (line A2) passing through an inflection point of the rising portion in the UPS spectrum and a line along the horizontal axis passing through a right ordinate intercept of the USP spectrum (line B2) is 3.56 eV. These binding energy points are considered to be the binding energy points of the upper ends of the valence bands of the zinc oxide films. These results show that the 450° C. annealed film has a greater energy difference between the Fermi level of the zinc oxide film (the origin of the horizontal axis) and the upper end of the valence band than the as-depo. film.

As described above, the PL measurements (FIG. 8) show that the band gap in the 450° C. annealed film is 3.26 eV as determined from the band-edge luminescence peak position. Although the shape of the band-edge luminescence peak is not clear, the as-depo. film also has a peak at the same energy point. Thus, the band gap in the as-depo. film is the same as the 450° C. annealed film. Because the band gap is the same, and the binding energy at the upper end of the valence band has the relationship described above, the energy point of a lower end of a conduction band in the 450° C. annealed film has higher binding energy than the as-depo. film and is present in a region having higher binding energy than the Fermi level.

Although not shown in the figure, the binding energy at the upper end of the valence band in the 200° C. annealed film and 300° C. annealed film is also higher than the binding energy in the as-depo. film. The band-edge luminescence peak position of the PL spectra shown in FIG. 8 is also 3.26 eV. Thus, the energy point of the lower end of the conduction band in the 200° C. annealed film and 300° C. annealed film has higher binding energy than the as-depo. film and is present in a region having higher binding energy than the Fermi level.

Thus, the PL and UPS results show that the zinc oxide films subjected to heat treatment at the predetermined temperatures are in an electronic state having a band structure (d10 electron configuration) and has a lower end of a conduction band in a region having higher binding energy than the Fermi energy.

6. Measurement of Hall Effect

In order to determine the carrier density of an as-depo. film, 200° C. annealed film, 300° C. annealed film, and 450° C. annealed film, the Hall effect was measured.

First, an as-depo. film sample for use in the measurement of the Hall effect was prepared by forming a zinc oxide film (thickness: 20 nm) on a quartz glass substrate by sputtering. 200° C. annealed film, 300° C. annealed film, and 450° C. annealed film samples were prepared by forming a zinc oxide film (thickness: 20 nm) on a quartz glass substrate by sputtering and heat-treating the zinc oxide film at a temperature of 200° C., 350° C., and 450° C. It was confirmed by another method that zinc oxide films formed on a quartz glass substrate had substantially the same quality as zinc oxide films formed on an ITO substrate.

Figure 11:
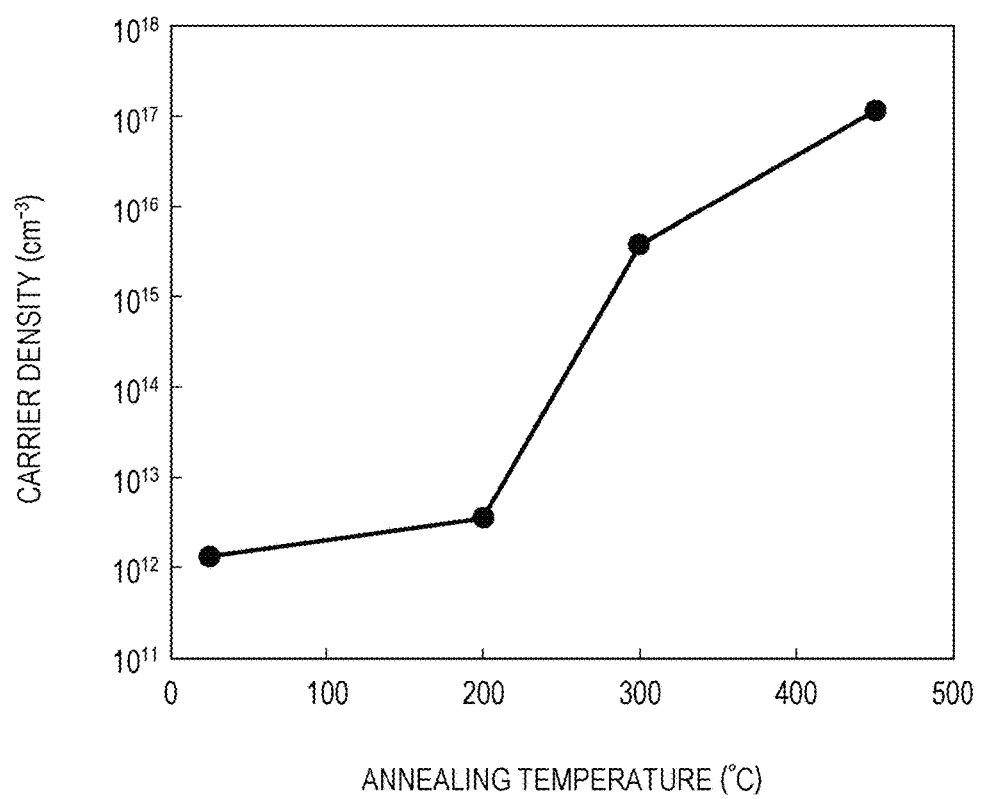
FIG. 11 is a graph showing the carrier density of zinc oxide films (as-depo. film, 200° C. annealed film, 300° C. annealed film, and 450° C. annealed film) as a function of annealing temperature.

The conditions for the measurement of the Hall effect are as follows:

Conditions for the Measurement of the Hall Effect:
    Apparatus: ResiTest 8310 (manufactured by Toyo Corporation)
    Version: Ver. 3.97
    Measurement mode: High-resistance mode
    Measurement current: $2.0 \times 10^{-7}$ A
    Measurement magnetic field: 0.3 Tesla
    Measurement frequency: 20 mHz FIG. 11 is a graph showing the carrier density of zinc oxide films as a function of annealing temperature. The horizontal axis represents the annealing temperature of zinc oxide films, and the vertical axis represents the carrier density. The measurements of the Hall effect show that the carriers detected in all the samples are electrons.

The graph in FIG. 11 shows that the carrier density of zinc oxide films increases with the annealing temperature. The 200° C. annealed film has a slightly higher carrier density than the as-depo. film. The 300° C. annealed film has a much higher carrier density than the as-depo. film. This result shows that the carrier density increases when the annealing temperature is higher than the threshold temperature of 200° C.

The PL and UPS results show that the zinc oxide films subjected to heat treatment at the predetermined temperatures are in an electronic state having a band structure (d10 electron configuration) and has a lower end of a conduction band in a region having higher binding energy than the Fermi energy. Furthermore, the measurements of the Hall effect show that heat treatment at 200° C. or more increases the electron carrier density of the zinc oxide films.

An increase in electron carrier density (higher density) means an increase in the density of donor levels in zinc oxide. An increase in the density of donor levels in zinc oxide results in a smaller gap between the Fermi level and the energy point of the lower end of the conduction band in the zinc oxide. Thus, an increase in the density of donor levels by annealing changed the electronic state such that the energy point of the lower end of the conduction band could be present in a region having higher binding energy than the Fermi level.

There are various opinions as to the origin of donor levels of zinc oxide. According to "Tomeidodenmaku no gijutsu (Technique for transparent electrically conductive film", Ohmsha, Ltd. (2008), donor levels in the vicinity of the lower end of the conduction band in zinc oxide are due to zinc between lattices of zinc oxide. More specifically, a high ratio of zinc to oxygen, a high degree of crystallinity (large crystal grains), and an electronic state having a band structure (d10 electron configuration) resulting from reduced impurity levels in the band gap probably result in an increase in the density of donor levels. An increase in the density of donor levels probably changes the electronic state such that the energy point of the lower end of the conduction band can be present in a region having higher binding energy than the Fermi level.

Characteristics of Device

Organic EL devices that included an as-depo. film, 200° C. annealed film, 300° C. annealed film, and 450° C. annealed film as electron-injection layers were manufactured. The characteristics of the organic EL devices were examined. An organic EL device according to a comparative example that included an as-depo. film as an electron-injection layer is hereinafter referred to as an as-depo-BPD. Organic EL devices according to examples that included a 200° C. annealed film, 300° C. annealed film, and 450° C. annealed film as electron-injection layers are hereinafter referred to as a 200° C.-annealed-BPD, 300° C.-annealed-BPD, and 450° C.-annealed-BPD, respectively.

The organic EL devices have the same structure as the organic EL device 100 illustrated in FIG. 1. The organic EL devices were manufactured by using the method described above. In the manufacture of the as-depo-BPD, the substrate temperature in the formation of the zinc oxide film serving as the electron-injection layer was room temperature. After the formation of the zinc oxide film at room temperature, the organic EL devices other than the as-depo-BPD were subjected to heat treatment in the atmosphere.

Each of the organic EL devices was coupled to a direct-current power supply, and a voltage was applied to the organic EL devices. While the applied voltage was changed, the electric current was measured. The electric current was divided by the area of the organic EL devices to calculate the current density.

Figure 12:
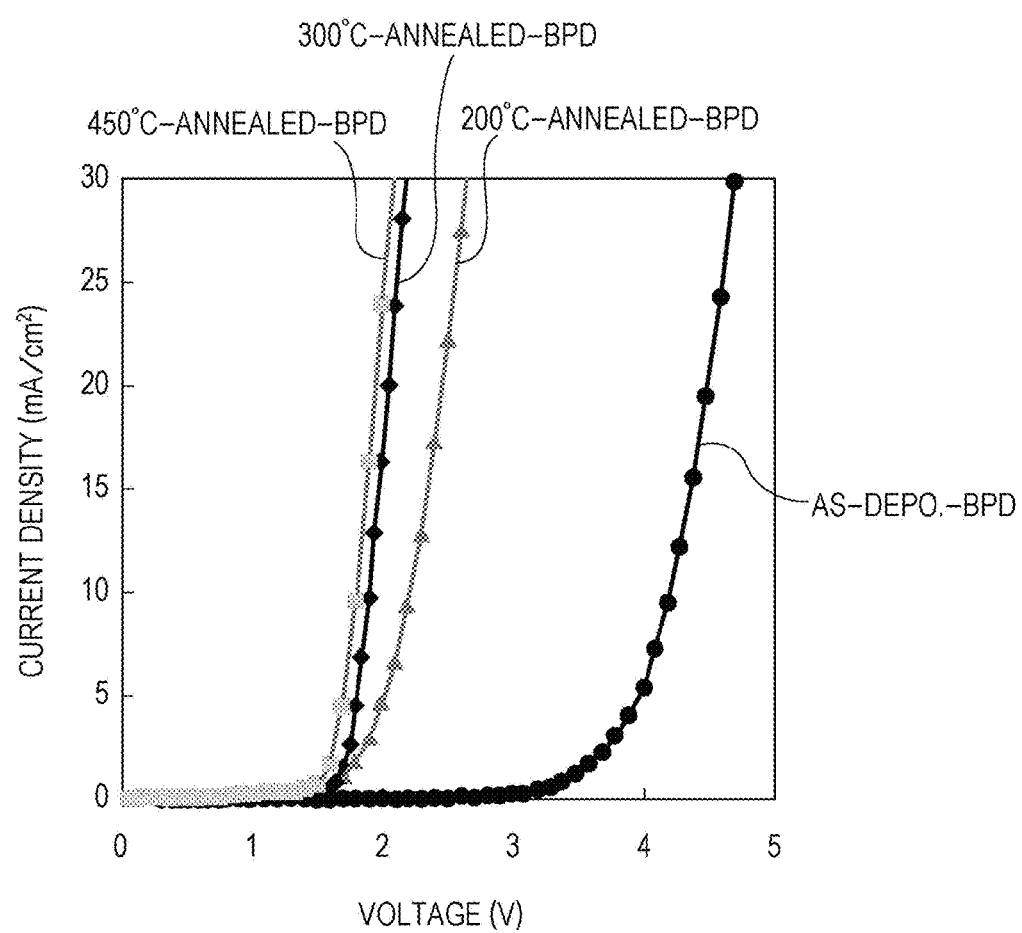
FIG. 12 is a graph showing the current density of organic EL devices according to examples and comparative examples as a function of applied voltage.

FIG. 12 is a graph showing current density-applied voltage curves of the organic EL devices (as-depo-BPD, 200° C.-annealed-BPD, 300° C.-annealed-BPD, and 450° C.-annealed-BPD). The vertical axis represents the current density ($mA/cm^2$), and the horizontal axis represents the applied voltage (V).

FIG. 12 shows that the current density-applied voltage curves of the organic EL devices that included the zinc oxide film subjected to heat treatment (200° C.-annealed-BPD, 300° C.-annealed-BPD, and 450° C.-annealed-BPD) rose at lower voltages than the curve of the organic EL device that included the zinc oxide film not subjected to heat treatment (as-depo-BPD). Thus, the organic EL devices that included the zinc oxide film subjected to heat treatment could have high current densities at lower applied voltages.

Thus, organic EL devices that include a zinc oxide film subjected to heat treatment at a predetermined temperature as an electron-injection layer can operate at lower voltages than known organic EL devices that include a zinc oxide film not subjected to heat treatment.

Heat treatment of a zinc oxide film can increase the crystal grain size for the following reason. In heat treatment of an electron-injection layer formed of zinc oxide, atoms of the zinc oxide having an amorphous structure or nanocrystal shape are rearranged by thermal energy, and thereby crystals grow. Thus, crystal grains become large and grow in the thickness direction of an electron-injection layer, for example. Some of crystal grains come into contact with a functional layer and a cathode on the top and bottom of the electron-injection layer. Some of crystal grains have a maximum length of 30 nm or more.

Mechanism of Electron Injection and Conduction in Zinc Oxide

Figure 13A:
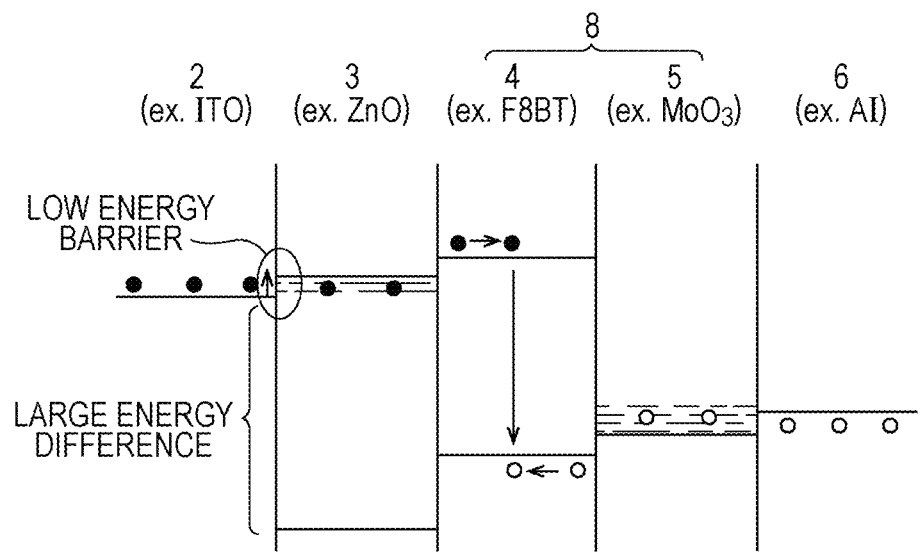
FIGS. 13A and 13B are energy diagrams of organic EL devices according to examples and comparative examples, respectively.
Figure 13B:
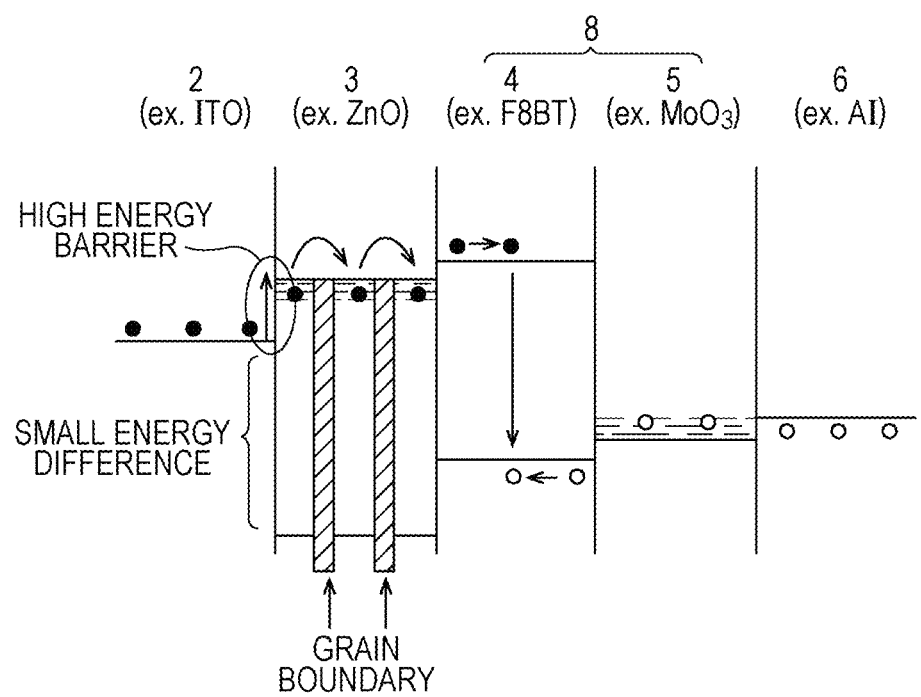

FIGS. 13A and 13B are energy diagrams of an organic EL device according to an example that included a zinc oxide film subjected to heat treatment at 200° C. or more and an organic EL device according to a comparative example that included an as-depo. film as an electron-injection layer, respectively.

The organic EL devices according to the examples (200° C.-annealed-BPD, 300° C.-annealed-BPD, and 450° C.-annealed-BPD) have satisfactory characteristics for the following reasons (i) to (iii):

(i) In the organic EL devices according to the examples, the Fermi level of the electron-injection layer (identical to the Fermi level of the cathode) is in the vicinity of the lower end of the conduction band. Thus, as shown in FIGS. 13A and 13B, the electron-injection barrier between the cathode 2 and the electron-injection layer 3 is lower in the organic EL devices according to the examples than in the organic EL device according to the comparative example. This results in high efficiency in electron injection from the cathode 2 to the electron-injection layer 3.

(ii) As shown in 13A, in the organic EL devices according to the examples, the electron-injection layer 3 has high crystallinity and dense conductive donor levels. The donor levels are continuous between the cathode 2 and the functional layer 8. Thus, electrons in the electron-injection layer 3 flow through the s orbital, which has high electron conductivity, thereby achieving high electronic conduction. In contrast, in the organic EL device according to the comparative example, as shown in FIG. 13B, the electron-injection layer 3 has low crystallinity and many grain boundaries. Thus, the donor levels are discontinuous between the cathode 2 and the functional layer 8. This results in lower electron conductivity than the organic EL devices according to the examples.

(iii) In the organic EL devices according to the examples, the electron-injection layer 3 contains a metal element (zinc) having a d10 electron configuration. Thus, electrons injected into the conduction band of the s orbital from the cathode 2 are strongly repelled by the closed valence band and are forced from the electron-injection layer 3 into the lowest unoccupied molecular orbital (LUMO) of the adjacent functional layer 8. This results in high efficiency in electron injection from the electron-injection layer 3 to the functional layer 8.

An electron-injection layer formed of zinc oxide of low crystallinity, such as the as-depo. film, does not satisfy (i), or does not satisfy (ii) because it has no band structure, or does not satisfy (iii) due to many impurity defects in the band. Thus, although the zinc oxide films according to the present embodiments have high crystallinity, excess zinc between lattices forms dense donor levels, and the lower end of the conduction band is equal to or higher than the Fermi level. Thus, the zinc oxide films can form layers having high electron-injection efficiency. Crystallinity is defined by the crystal grain size observed with TEM or the full width at half maximum measured by XRD.

Although the characteristics of zinc oxide films and the characteristics of organic EL devices that include a zinc oxide film as an electron-injection layer are described above, the electron-injection layers according to the present embodiments may be films other than the zinc oxide films.

Another metallic compound film that contains a metal element having a d10 electron configuration may be used as an electron-injection layer. Even in such a case, for example, the substrate temperature during film formation can be increased (or the resulting film is subjected to heat treatment) to form a high-crystallinity electron-injection layer that contains crystal grains in contact with both a cathode and a functional layer or crystal grains having a maximum length of 30 nm or more. Such an electron-injection layer also has the same advantages as the zinc oxide films.

Another metallic compound may be a compound of at least one metal element selected from zinc, gallium, indium, thallium, germanium, tin, lead, arsenic, antimony, and bismuth and an element of the nitrogen group; a compound of at least one metal element selected from zinc, gallium, indium, thallium, germanium, tin, lead, arsenic, antimony, and bismuth and an element of the oxygen group; or a compound of at least one metal element selected from zinc, gallium, indium, thallium, germanium, tin, lead, arsenic, antimony, and bismuth and a halogen element. These metal elements can be in an electronic state having a d10 electron configuration.

The donor levels may be increased by doping a metallic compound containing a metal element having a d10 electron configuration with a minute amount of metal element in a group that is heavier than the family of the former metal element. Examples of metallic compounds having increased donor levels include zinc oxides doped with a minute amount of boron, aluminum, gallium, or indium.

These results show that the electron-injection layers according to the present embodiments can be formed by heat treatment of a metal oxide film, which is formed by sputtering, at a temperature of 200° C. or more. Alternatively, the electron-injection layers according to the present embodiments can be formed by forming a metal oxide film on a substrate by sputtering at a substrate temperature of 200° C. or more. The electron-injection layers according to the present embodiments may be formed using another method.

For example, if a metal oxide film can be provided with thermal energy after or during film formation, vacuum evaporation may be used. It is desirable that the heat treatment temperature after film formation or the substrate temperature during film formation (collectively referred to as "heating temperature") be the temperature at which the metallic compound can be crystallized. For example, in a zinc oxide film having a thickness in the range of 5 to 80 nm (for example, 20 nm), zinc oxide having an amorphous structure can easily be crystallized to have a hexagonal wurtzite structure at a temperature of 200° C. or more. Thus, the heating temperature of a zinc oxide film having a thickness of 20 nm may be 200° C. or more. The heating temperature may be 1200° C. or less. Heating at a high temperature of 1200° C. or more promotes grain growth in a zinc oxide film, increases the grain size, and increases the surface roughness of the zinc oxide film. Use of such a zinc oxide film as an electron-injection layer may result in characteristic degradation, such as an increased leakage current. The crystallization temperature of a metallic compound can depend on the material and thickness of the metal oxide film. Thus, it is desirable that a metallic compound be crystallized in a temperature range that depends on the material and intended thickness of the metallic compound film.

Although the organic EL device 100 illustrated in FIG. 1 is of a bottom emission type, the present embodiments can be applied to organic EL devices of a top emission type.

An organic EL device according to the present disclosure can be used in displays of mobile phones, display devices of television sets, and various light sources. An organic EL device according to the present disclosure can be used in any application as a low-voltage driving organic EL device in a wide luminance range from low luminance to high luminance for light sources or the like. Because of its high performance, an organic EL device according to the present disclosure can be widely used in various display units, television sets, displays for portable electronic equipment, and illumination light sources for household, public, and business use.

What is claimed is:

1. An organic light-emitting device comprising:
   a cathode;
   an anode facing the cathode;
   a functional layer located between the cathode and the anode, the functional layer including a light-emitting layer; and
   an electron-injection layer located between the cathode and the functional layer, the electron-injection layer at least partially composed of a metallic compound containing a metal element, wherein
   the electron-injection layer includes crystal grains in which the metallic compound is crystallized and the metal element has a d10 electron configuration in the outermost shell, and
   at least one of the crystal grains is in contact with both the cathode and the functional layer.

2. The organic light-emitting device according to claim 1, wherein the electron-injection layer includes an amorphous body in which the metallic compound has an amorphous structure, the amorphous body filling spaces made by the crystal grains in the electron-injection layer.

3. The organic light-emitting device according to claim 1, wherein at least one of the crystal grains has a maximum length of 30 nm or more in a vertical section of the electron-injection layer.

4. The organic light-emitting device according to claim 1, wherein the metallic compound is zinc oxide.

5. The organic light-emitting device according to claim 4, wherein the metallic compound is represented by a composition formula ZnOx, wherein x is 0.9 or more and less than 1.

6. The organic light-emitting device according to claim 1, wherein the electron-injection layer is doped with a group IIIB element.

* * * * *